US005204498A

United States Patent [19]

Russell

[11] Patent Number: 5,204,498

[45] Date of Patent: Apr. 20, 1993

[54] PACKAGING ASSEMBLY

[75] Inventor: Larry L. Russell, Lexington, Ohio

[73] Assignee: Therm-O-Disc, Incorporated, Mansfield, Ohio

[21] Appl. No.: 811,701

[22] Filed: Dec. 30, 1991

[51] Int. Cl.[5] .......... H05K 5/00

[52] U.S. Cl. .......... 174/52.1; 337/414; 361/390

[58] Field of Search .......... 337/4, 405, 414; 174/52.1, 52.4; 361/400, 380, 417, 419, 390

[56] References Cited

U.S. PATENT DOCUMENTS 3,912,984 10/1975 Lockhart, Jr. et al. .......... 361/400

4,968,962 11/1990 Hohider et al. .......... 337/4

*Primary Examiner*—Leo P. Picard
*Assistant Examiner*—Bot Ledynh
*Attorney, Agent, or Firm*—Jones, Day,Reavis & Pogue

[57] ABSTRACT

A packaging unit consisting of two molded plastic boxes, each having one side open. One of the boxes is laid flat with the open side up and receives therein a thermal cutoff/clip/resistor assembly. The other molded plastic box is placed over the first and the two are held together by symmetrical interlocking devices. The covers serve as assembly fixtures and protective housing.

10 Claims, 2 Drawing Sheets

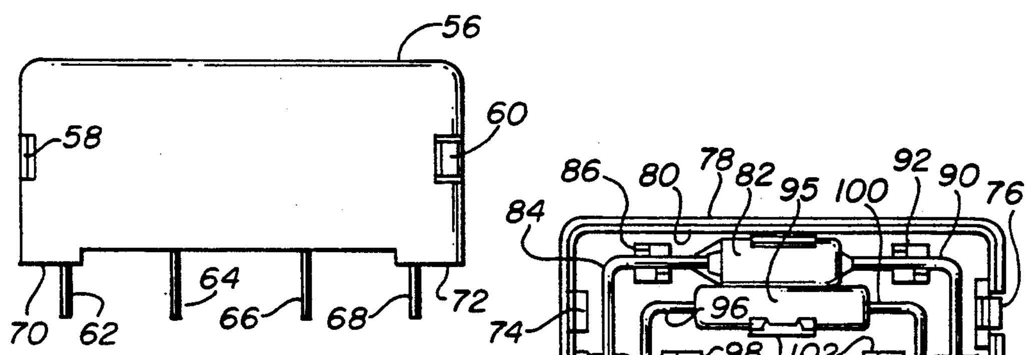
FIG. 5
FIG. 6
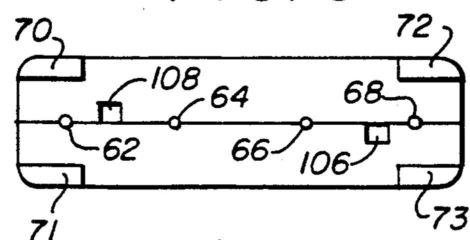
FIG. 7
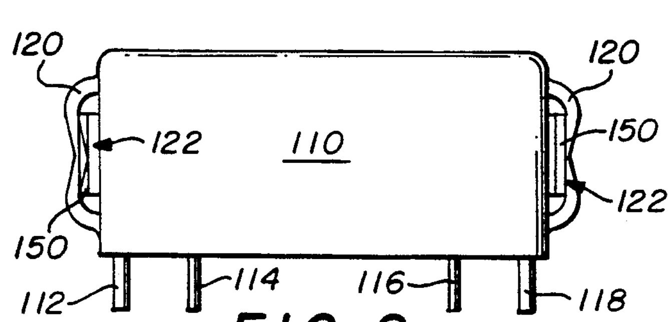
FIG. 8
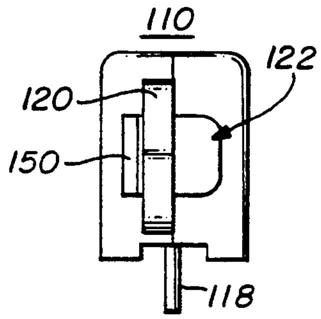
FIG. 10
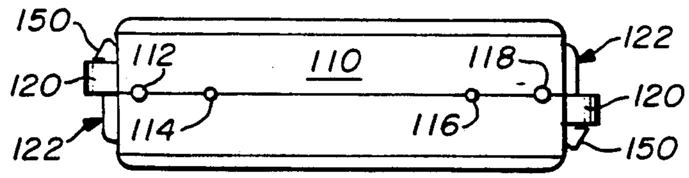
FIG. 11
127 130 144 146 134 120 128 150 132 138 136 122 112 140 148 142 114 116 118
FIG. 9

PACKAGING ASSEMBLY

FIELD OF THE INVENTION

This application relates to the art of electric circuit component assemblies and, more particularly, to a packaging assembly of components used for circuit protection. The invention is particularly applicable to packaging assemblies for holding thermal cutoffs and to assembling the same with heating resistors. However, it will be appreciated that certain features of the invention have broader aspects and can be used for other purposes.

BACKGROUND OF THE INVENTION

As disclosed in U.S. Pat. No. 4,968,962, thermal cutoffs are commonly combined with a resistance heater. In the event of a circuit malfunction, the resistance heater is energized for rapidly raising the thermal cutoff to a temperature at which it operates to provide an open circuit. U.S. Pat. No. 4,968,962 discloses a simplified way of mounting a thermal cutoff and for assembling the same in heat transfer relationship with a resistor. In one arrangement, the thermal cutoff and resistor are held in physical contact one with another by a metal clip. Each of the thermal cutoff and resistor has leads which may be specially shaped to provide a standoff for supporting the assembly above a printed circuit board. A holder of dielectric material is preferably provided for holding the assembled thermal cutoff and resistor. The holder includes a base and a pair of spaced apart supports extending outwardly from one side of the base. The supports have terminal end portions having lead receiving means for receiving and supporting the leads on the thermal cutoff to hold the cutoff suspended between the supports. Holes through the base adjacent the supports receive the leads on the thermal cutoff. Thus, the holder provides a means for holding an assembled thermal cutoff and resistor in a desired relationship with one another.

It would be desirable to have a single molded part that provides ease of assembly of the assembled thermal cutoff and resistor with the molded part being symmetrical such that the same part serves as either the base or the cover.

SUMMARY OF THE INVENTION

The present invention in the preferred embodiment provides a housing consisting of two symmetrical, molded plastic boxes with one side open. One of the symmetrical halves of the housing is laid flat, open side up and can receive therein a thermal cutoff/clip/resistor assembly as disclosed in U.S. Pat. No. 4,968,962. The second half of the housing is placed over the first and the two halves are held together in a unitary assembly by symmetrical interlocking means. The two housing halves serve as assembly fixtures and a protective housing.

Thus, the present invention provides an assembly fixture and protective housing in one structure. The assembly can be board mounted and safely conformally coated. The preassembled thermal cutoff/clip/resistor assembly is easily placed in one of the rectangular-shaped housing halves because each housing half contains a plurality of elongated recesses integrally formed therein for receiving and supporting the leads of the thermal cutoff/clip/resistor assembly. Corresponding ones of the recesses in the other housing half are placed in abutting relationship when the housing halves are snapped together to form an enclosed channel for receiving and supporting the leads. The leads of the thermal cutoff/clip/resistor assembly extend from orifices in the housing formed by joining the two halves together. Each housing half includes a U-shaped member integrally formed on one end thereof with a flexible arm having a catch thereon on the other end of each housing half and having a catch thereon for extending through the U-shaped member when the housing halves are placed in abutting relationship such that the catch on the flexible arm engages the U-shaped member to hold the housing halves securely attached to each other.

It is, therefore, a principal object of the present invention to provide a single molded symmetrical housing half to provide ease of assembly of a thermal cutoff/-clip/resistor assembly in the half of the housing then utilizing a corresponding symmetrical part as the cover which is placed over the first half and the two halves held together by symmetrical interlocking means.

It is another object of the invention to provide two halves of a box-like housing with integral snap-together means containing therein a thermal cutoff/clip/resistor assembly whose leads project therefrom.

It is a further object of the invention to provide a U-shaped member integrally formed on one end of each of the housing halves and a flexible arm on the other end of each housing half and having a catch thereon for extending through the U-shaped member when the housing halves are placed in abutting relationship such that the catch on the flexible arm engages the U-shaped member to hold the housing halves securely attached to each other.

It is an additional object of the invention to provide two halves of a box-like housing with integral snap-together means containing therein an electrical assembly whose leads project therefrom.

BRIEF DESCRIPTION OF THE DRAWINGS

These and other objects of the present invention will be more fully understood when taken in conjunction with the accompanying detailed specification and the attached drawings in which like numerals represent like components and in which:

FIG. 5 is a side view of an alternate embodiment of a housing with integral snap-together means containing therein an electric assembly whose leads project therefrom;

FIG. 6 is a plan view of one-half of the packaging assembly illustrated in FIG. 5 showing the location of the thermal cutoff/clip/resistor assembly and the positioning of the leads therein;

FIG. 7 is a bottom view of the novel packaging assembly illustrated in FIG. 5;

FIG. 8 is a side view of a second alternate embodiment of a box-like housing formed of two halves with integral snap-together means and containing therein an electric assembly whose leads project therefrom;

FIG. 9 is a plan view of one of the sides of the housing shown in FIG. 8 illustrating the thermal cutoff/-clip/resistor assembly mounted therein with the leads projecting therefrom;

FIG. 10 is an end view of the housing unit illustrated in FIG. 8; and

FIG. 11 is a bottom view of the housing assembly illustrated in FIG. 8.

DETAILED DESCRIPTION OF THE DRAWINGS

Figure 1:
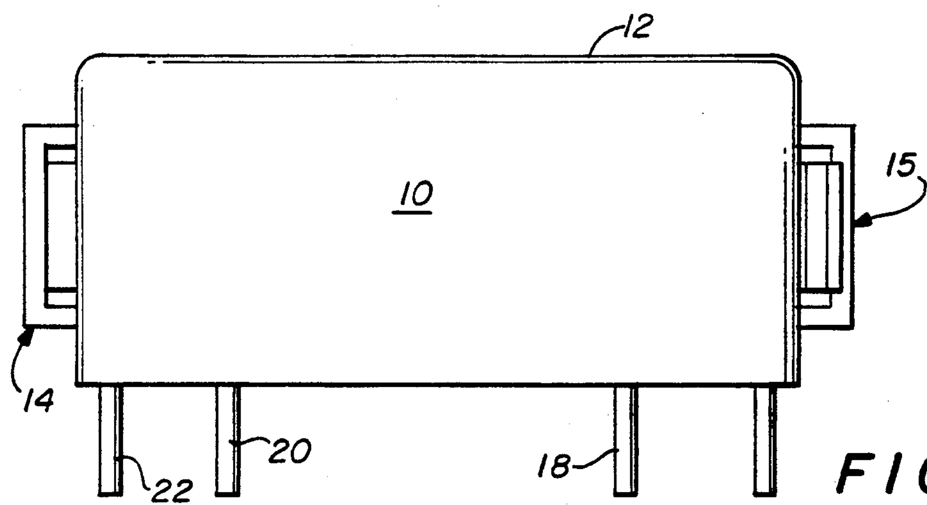
FIG. 1 is a side view of a housing consisting of two symmetrical molded plastic boxes with integral snap-together means containing therein an electric assembly whose leads project therefrom.
Figure 3:
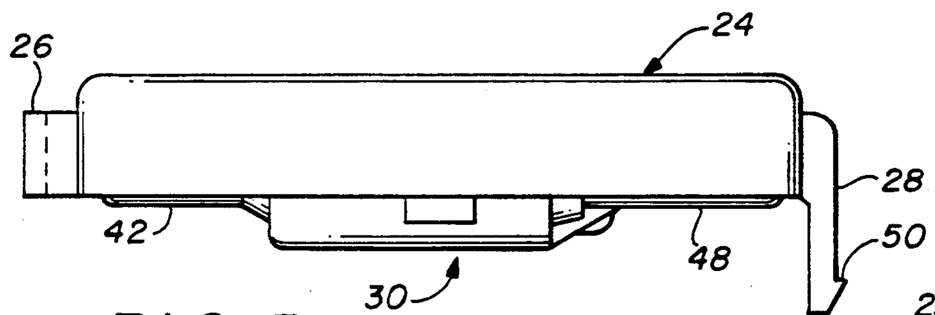
FIG. 3 is a top view of the box or housing half shown in FIG. 2.
Figure 4:
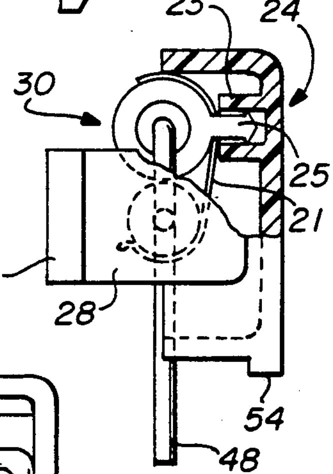
FIG. 4 is an end view of the housing half illustrated in FIG. 2.
Figure 2:
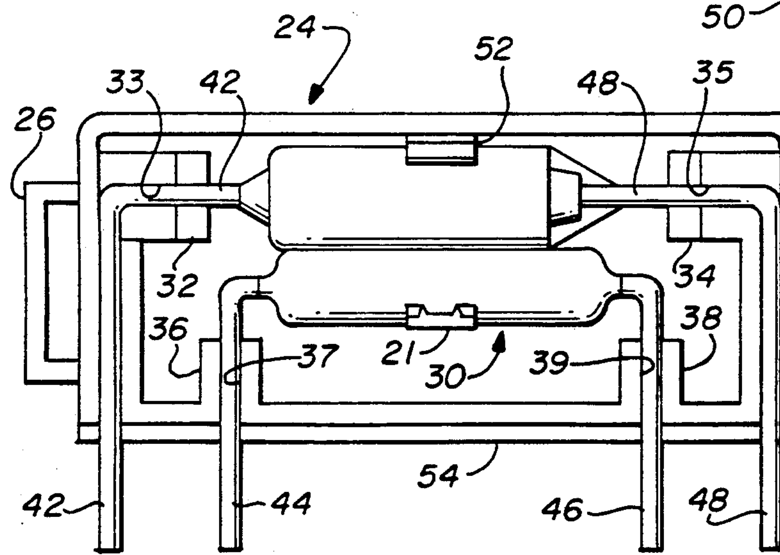
FIG. 2 is a plan view of one of the symmetrical molded plastic boxes illustrating the inside thereof and the interlocking means integrally formed therewith.

FIG. 1 is a side view of the package assembly 10 of the present invention. It includes a housing 12 which is formed of two symmetrical identical sections 24 as shown in FIGS. 2, 3 and 4. It also has snap-together fixtures 14 and 15 at each end that interlock with each other to hold the halves together. Electrical leads 16, 18, 20 and 22 from the electrical assembly inside the housing 12 extend from the bottom thereof as illustrated.

FIG. 2 is a plan view of one half 24 of the symmetrical halves forming the housing 12. In FIG. 2, a thermal cutoff/clip/resisitor assembly 30 is illustrated as being placed in one half 24 of the housing 12. It will be noted that the leads 42 and 48 from the thermal cutoff assembly are contained in L-shaped recesses 33 and 35, respectively, so that the leads 42 and 48 protrude from the bottom of the housing half 24. Grooves or recesses 33 and 35 are formed in components 33 and 35 which are integrally formed in each housing half for receiving and supporting the leads 42 and 48 of the thermal cutoff assembly. In addition, the leads 44 and 46 from the resistor are placed in recesses 37 and 39 in components 36 and 38 integrally formed in each housing half 24 for receiving and supporting the resistor leads 44 and 46. A vent hole 52 is formed in the event the unit is to be plotted or otherwise filled with other material not shown. Clip 21 has a projection 25 thereon that is received by a slot in member 23 integrally formed with housing half 24 to attach the clip 21 to housing 24.

A substantially U-shaped member 26 is integrally formed on one end of each of said housing halves 24 and a flexible arm 28 is formed on the other end of each housing half 24 and has a catch 50 thereon for extending through the U-shaped member 26 when the housing halves are placed in abutting relationship such that the catch 50 on the flexible arm 28 engages the U-shaped member 26 to hold the housing halves 24 securely attached to each other.

Thus, in the preferred embodiment, the two housing halves 24 are made symmetrical and, when one half is placed as illustrated in FIG. 2, the TCO/clip/resistor electrical assembly 30 can be placed in the housing as shown with the TCO leads 42 and 48 being surrounded by and supported by recesses 33 and 35 in components 32 and 34. In like manner, the resistor leads 44 and 46 are placed in recesses 37 and 39 of components 36 and 38, respectively, and then the other half 24 is placed on top of the half shown in FIG. 2 which are then snapped together using the U-shaped member 26 and the resilient arm 28 to form a unitary packaging housing with leads 42, 44, 46 and 48 extending from the bottom thereof. A ledge 54 is formed at the base of each housing half 24 along one side thereof to form a pair of supports on which the housing 12 may rest on a surface.

FIG. 5 is a side view of an alternate embodiment of the present housing which housing 56 is also formed of two halves, but the two halves are not symmetrical. Again, the housing halves are held together with integral snap-together means 58 and 60. As can be seen in FIG. 5, the leads 62, 64, 66 and 68 extend from the bottom of the packaging assembly 56. The unit 56 rests on projections 70 and 72 formed on the bottom thereof.

FIG. 6 is a plan view of one half of the housing 56 illustrating the placement of the thermal cutoff 82 and the resistor 94 held together by clip 104 and mounted in the side of one half of the housing 56. As can be seen in FIG. 6, lead 84 of thermal cutoff 82 is held by a recess or groove in blocks 86 and 88 The grooves are semicircular in shape and extend 180° around the lead 84. The supports 86 and 88 have grooves that are at 90° to each other to allow lead 84 to make a right angle turn or bend. In like manner, the lead 90 extending from the other end of the thermal cutout unit 82 also makes a 90° bend and rests in corresponding semicircular recesses in supports 92 and 94. In like manner, the lead 96 extending from resistor 95 is supported in a semicircular groove or recess in support 98. It then curves downwardly and out through an orifice in the bottom of the half of the housing as lead 64 as can be seen more clearly in FIG. 8. Again, in like manner, the other lead 100 extending from the other end of the resistor 95 is supported in a semicircular groove or recess in support 102. The lead then bends downwardly and extends out of the housing as lead 66 as shown again in FIG. 8. Thus, the electrical assembly including the thermal cutoff 82, the resistor 95 and the clip 104 is held securely in the one half of the housing 56 as shown in FIG. 6. When the other half is attached thereto, corresponding supports 86, 88, 92, 94, 98 and 102 abut the supports illustrated in FIG. 6 and completely surround and enclose the leads 84, 90, 96 and 100 extending from the thermal cutoff 82 and the resistor 95, thus providing a solid support for the electrical assembly. The casings or housing halves, as stated earlier, are not symmetrical. Thus, a lip 78 overhangs a ledge 80 as shown in FIG. 6. On the opposite half, the mating portion corresponding to lip 78 would be a ledge 80, while the part corresponding to ledge 80 would be a lip 78. The rectangular-shaped open area 74, shown in FIG. 6, receives on the mating half of the housing a projection corresponding to the flexible arm 76 shown in FIG. 6 at the other end. Again, arm 76 has a lip 77 which engages the open area 74 on the back side thereof to securely lock the two halves together.

FIG. 7 is a bottom view of the assembled package illustrating the leads 62, 64, 66 and 68 extending from the base thereof and also including a vent orifice 106 and 108 as well as legs 70, 71, 72 and 73 for supporting the package on a housing.

FIGS. 8, 9, 10 and 11 illustrate a third embodiment of the present invention. FIG. 8 is a side view of the package assembly 110 illustrating the leads 112, 114, 116 and 118 extending from the bottom of the package. The two halves of the package 110 are again held together by a generally U-shaped portion 120 at one end with a flexible arm 122 extending therethrough with a catch on the end thereof to lock the two halves together. In like manner, on the opposite end, generally U-shaped member 124 on one half has the flexible arm 126 from the other half extending therethrough with the catch thereon to latch the two halves together. FIG. 9 illustrates one half 127 of the package 110 with the electrical assembly installed therein. The electrical assembly comprises a thermal cutoff 128 and a thermal resistor 138 which are coupled together by a clip 148. The lead 112 extending from one end of thermal cutoff 128 is supported again in semicircular recesses in supports 130 and 132 after the lead 112 is bent at a right angle. In like manner, the other lead 118 at the other end is also bent at a right angle and is again supported in semicircular recesses in supports 134 and 136. Lead 114 from one end of resistor 138 is supported by semicircular recess in block 140 and the lead 116 at the other end of resistor 138 is bent at a right angle and supported in a semicircular recess in block 142. The housing half 127 is not symmetrical about its outer edge. It has, again, a projecting L-shaped lip 146 and a ledge 144 which mate with a corresponding ledge and lip on the other half. The generally U-shaped member 120 at one end accepts the flexible arm 122 at the other end having a clip or protrusion 150 at the outer end thereof to latch the two halves together. As can be seen in the end view in FIG. 10, the flexible arm 122 is under the generally U-shaped member 120 with the lip 150 firmly locking the two halves together. This can also be seen in FIG. 11 in which at one end the flexible arm 122 is under the U-shaped member 120 with the lip or catch 152 caught against the U-shaped member 120 to latch the two halves together. In like manner, at the other end the flexible arm 122 is under the U-shaped member 120 with the lip 150 engaging U-shaped member 120 to latch the two halves together.

Thus, there has been disclosed a novel packaging unit for an electrical assembly having projecting leads therefrom in which first and second symmetrical halves of a box-like housing contain the electrical assembly whose leads project therefrom. A snap lock assembly is integrally formed with the symmetrical first and second halves for enabling the halves to be securely snapped together to form an enclosed housing for the electrical assembly. Passageways within and formed by the symmetrical halves provide support for the projecting leads.

Each half of the packaging unit is of generally rectangular shape having a base and four side walls. A plurality of elongated semicircular recesses are integrally formed in each housing half for receiving and supporting the leads that project therefrom. Corresponding ones of the recesses are in abutting relationship when the housing halves are snapped together to form an enclosed channel for receiving the leads. At least some of the elongated recesses form right angles for receiving the leads bent at right angles.

The packaging assembly includes a U-shaped member integrally formed on one end of each of the housing halves and a flexible arm on the other end of each housing half and having a catch thereon for extending through the U-shaped member when the housing halves are placed in abutting relationship such that the catch on the flexible arm engages the U-shaped member to hold the housing halves securely attached to each other. The periphery of the mating housing halves need not be symmetrical but could comprise a projecting lip and associated ledge that mate with a reverse configuration on the other half much like a tongue-and-groove configuration.

While the invention has been shown and described with respect to particular embodiments thereof, this is for the purpose of illustration rather than limitation, and other variations and modifications of the specific embodiment herein shown and described will be apparent to those skilled in the art all within the intended spirit and scope of the invention. Accordingly, the patent is not to be limited in scope and effect to the specific embodiment herein shown and described nor in any other way that is inconsistent with the extent to which the progress in the art has been advanced by the invention.

I claim:

1. A packaging unit for an electrical assembly having projecting leads therefrom comprising:
- first and second halves of a box-like housing for containing the electrical assembly whose leads project therefrom;
- symmetrical mating means integrally formed on each of the first and second halves for snapping the halves securely together to form an enclosed housing for the electrical assembly; and
- passageways within and formed by the housing halves for supporting the projecting leads.

2. An assembly as in claim 1 wherein each half of said housing comprises:
- a generally rectangular-shaped housing having a base and four side walls;
- a plurality of elongated recesses integrally formed in each housing half for receiving and supporting said leads that project therefrom;
- corresponding ones of said recesses being in abutting relationship when the housing halves are snapped together to form an enclosed channel for receiving the leads; and
- at least some of said elongated recesses forming right angles for receiving said leads bent at right angles.

3. A packaging unit as in claim 1 wherein symmetrical mating means for snapping said halves together comprises:
- a U-shaped member integrally formed on one end of each of said housing halves; and
- a flexible arm on the other end of each housing half and having a catch thereon for extending through said U-shaped member when said housing halves are placed in abutting relationship such that said catch on said flexible arm engages the U-shaped member to hold the housing halves securely attached to each other.

4. A packaging unit as in claim 3 wherein:
- the U-shaped member is integrally formed with and projects longitudinally outwardly from one end of each housing half; and
- said flexible arm is integrally formed with the other end of each housing half and extends outwardly and transversely from said other end of each housing half.

5. A packaging unit as in claim 4 further comprising a plurality of integrally formed projections on the enclosed housing on that portion from which the projecting leads extend such that the housing may be positioned vertically on that portion of the packaging unit from which the leads extend to enable the leads to be attached to a circuit.

6. A packaging unit as in claim 1 wherein said housing halves are symmetrical in shape.

7. A packaging unit as in claim 1 further comprising:
- an L-shaped lip on the periphery of one of said housing halves; and
- an inverted L-shaped lip on the periphery of the other one of said housing halves such that the peripheries of the two halves form a mating fit when the two halves are assembled together.

8. A packaging unit for an electrical assembly comprising:

a housing consisting of two halves containing at least one support for receiving an electronic assembly having at least one lead;

each housing half being generally rectangular in shape and comprising a base and four side walls;

at least one half of the at least one support for receiving the at least one lead on said electronic assembly being formed on each housing half; and symmetrical mating means on the housing halves for snapping said halves together to contain said electrical assembly with the at least one lead protruding therefrom.

9. A packaging unit as in claim 8 wherein said housing halves are identical in construction.

10. A packaging unit as in claim 8 wherein each half of said housing comprises:

a generally rectangular-shaped housing having a base and four side walls;

a plurality of elongated recesses forming said at least one support, the recesses being integrally formed on each housing half for receiving and supporting said leads that project therefrom, corresponding ones of said recesses being in abutting relationship when said housing halves are snapped together to form an enclosed channel for receiving the leads; and at least some of said elongated recesses forming right angles for using said leads bent at a right angle.

* * * * *